United States Patent [19]

Gilbert

[11] 4,419,630

[45] Dec. 6, 1983

[54] PHASE DEMODULATOR UTILIZING A FREQUENCY DIVIDER, SYNCHRONOUS FILTER, AND PHASE COMPARATOR

[75] Inventor: Paul H. Gilbert, Silver Spring, Md.

[73] Assignee: The United State of America as represented by the Secretary of the Navy, Washington, D.C.

[21] Appl. No.: 260,629

[22] Filed: May 5, 1981

[51] Int. Cl.³ .................... H03D 3/02; H03K 9/06
[52] U.S. Cl. ................................. 329/50; 329/103; 329/107; 329/110
[58] Field of Search ............... 329/50, 103, 104, 107, 329/110; 455/214, 337; 375/80, 82; 307/510, 511, 529, 543

[56] References Cited

U.S. PATENT DOCUMENTS 2,114,335  4/1938  Crosby ........................... 455/214
4,059,805  10/1977  de Laage de Meux et al. ..... 329/50

Primary Examiner—Siegfried H. Grimm
Assistant Examiner—S. V. Clark

[57] ABSTRACT

A phase demodulator for recovering the modulating wave from a phase-modulated wave. A frequency divider is provided to divide the phase-modulated wave in frequency to produce a phase-modulated subharmonic wave which is compared in a phase comparator with a signal produced by passing the phase-modulated subharmonic wave through a syncrhonous filter set at its carrier frequency. The filtered output of the phase comparator is proportional to the amplitude of the modulating wave.

13 Claims, 11 Drawing Figures

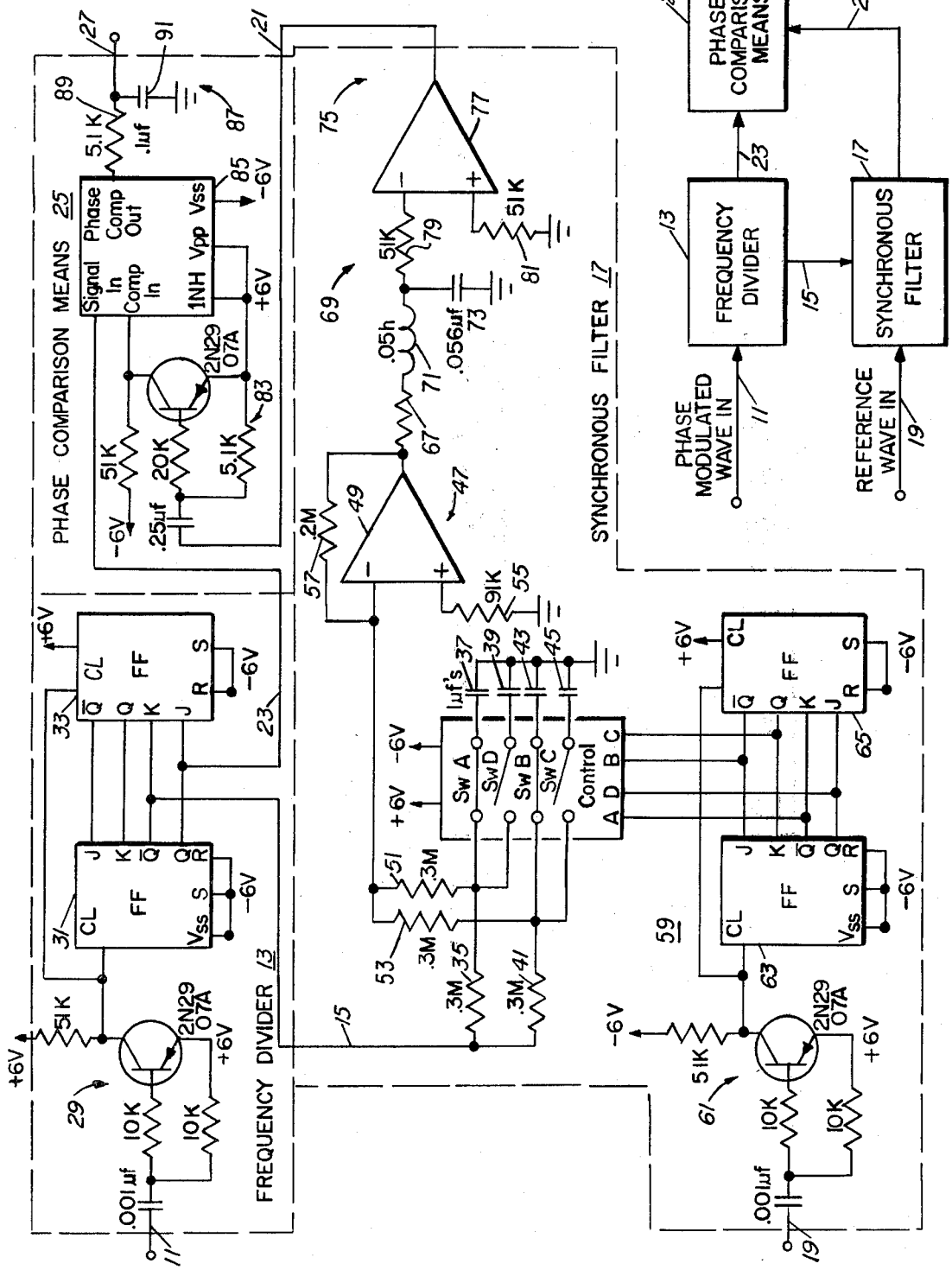

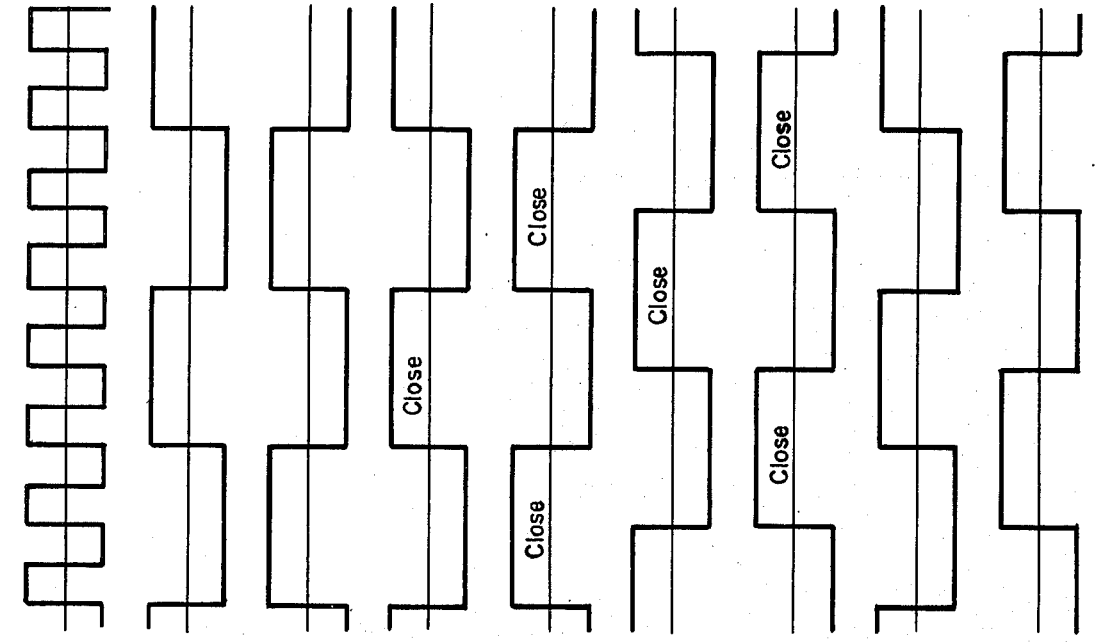

PHASE DEMODULATOR UTILIZING A FREQUENCY DIVIDER, SYNCHRONOUS FILTER, AND PHASE COMPARATOR

BACKGROUND OF THE INVENTION

The present invention relates generally to systems for processing signals, and more particularly to systems for processing the phase of signals.

Missile guidance systems are known which rely on target-generated radiation for radio frequency homing. The angle needed for guidance is determined from the difference in phase between radiation wavefronts arriving simultaneously at two antennas which are equally spaced apart about the missile's center-line and rolling with the missile. Since the antennas look at all planes of incoming radiation during each roll cycle, the phase difference between received wavefronts will be a sinusoidal function of time at the constant roll frequency. In the circuitry following the antennas, the two antenna outputs are first processed to provide two video signals which are proportional to the sine and cosine of the phase difference between received wavefronts, respectively. Next, the two video signals are multiplied by two quadrature signals at 12 KHz and summed to produce a 12 KHz carrier that is phase-modulated by a modulating wave whose amplitude equals the phase difference between received wavefronts. In the past, the modulating wave was recovered by supplying the phase-modulated wave to a phase-locked loop, detecting the resulting frequency modulation as the control voltage of the voltage-controlled oscillator in the loop, and thereafter passing the output through an integrator to detect the phase-modulation. Since the control voltage is a small quantity, the output of the integrator had to be amplified by a factor of 100.

OBJECTS OF THE INVENTION

Accordingly, it is an object of the present invention to provide an improved system for recovering the desired phase modulation of a phase modulated wave which dispenses with the use of a phase-locked loop.

It is a further object of the present invention to provide an improved system for recovering the phase modulation of a phase modulated wave which dispenses with the need for high gain at its output.

SUMMARY OF THE INVENTION

The objects of the present invention are achieved by a phase demodulator for recovering the modulating wave from a phase-modulated wave. A frequency divider divides the phase-modulated wave in frequency to produce a phase-modulated subharmonic wave which is passed to a synchronous filter and to a phase comparator. The synchronous filter is a digitally controlled analog bandpass filter which passes the unmodulated carrier component of the phase-modulated subharmonic wave while greatly attenuating the side-bands. The phase comparator compares the phase of the unmodulated carrier component passed by the synchronous filter (and shifted 90°) to the instantaneous phase of the phase-modulated subharmonic wave. The output is filtered to produce a voltage proportional to the difference in phases. Since in phase modulation, the difference in phases is proportional to the amplitude of the modulating wave, the output of the filter is a direct measure of the amplitude of the modulating wave.

The phase demodulator is easy to implement and less complex in form becuase it dispenses with the phase-locked loop required by the prior art circuitry and the need for high gain at the output of the demodulator.

BRIEF DESCRIPTION OF THE DRAWINGS

A more complete appreciation of the invention and many of its attendant advantages will be readily attained as it becomes better understood when considered in connection with the accompanying drawings, wherein:

FIG. 1 is a block diagram of the preferred embodiment of the phase demodulator of the invention.

FIG. 2 is a schematic circuit diagram of the preferred embodiment of the phase demodulator of the invention.

FIGS. 3(a)-(i) is a series of waveforms produced at various points in the schematic circuit diagram of FIG. 2.

DETAILED DESCRIPTION OF THE PREFERRED EMBODIMENT

Referring now to the drawings, wherein like reference numerals designate identical or corresponding parts throughout the several views, and more particularly to FIG. 1 thereof, there is shown a block diagram of the phase demodulator of the present invention. The phase modulated wave form from which the modulating wave is to be recovered is applied on lead 11 as input to a frequency divider 13. Frequency divider 13 divides the phase-modulated wave in frequency to produce a phase-modulated subharmonic wave having an unmodulated carrier component and side-band frequencies. The output of the frequency divider is applied on lead 15 to a synchronous filter 17 to which is also supplied on lead 19 an unmodulated reference wave whose frequency is identical to the center carrier frequency at rest of the phase-modulated wave. The synchronous filter 17 rejects the side-band frequencies of the phase-modulated subharmonic wave while passing the unmodulated carrier component on lead 21. The output of synchronous filter 17 on lead 21 comprising the unmodulated carrier component of the phase-modulated subharmonic wave and the output of the frequency divider on lead 23 comprising the phase-modulated subharmonic wave are provided to phase comparison means 25. Phase comparison means 25 compares the phase of the unmodulated carrier component and the instantaneous phase of the phase-modulated subharmonic wave to provide an output of lead 27 which is proportional to the amplitude of the modulating wave.

The specific circuit design shown was developed for application to a missile guidance system of the type wherein the instantaneous phase of a 12 KHz carrier is varied from its phase at rest by an amount proportional to the amplitude of a roll frequency modulating wave containing the desired guidance information.

Phase comparers of the type used here have unique outputs only over a ±90° range. But the interferometer action from the 5" antenna spacing at the higher microwave frequencies and the maximum offset angle will produce phase modulations in excess of ±360°. Consequently a frequency divider (which divides the phase excursions also) needs to be employed. The division shown here is 4:1, but the newer missile numbers will require an 8:1 divider.

Accordingly, the phase modulated wave, whose waveform is depicted in FIG. 3(a), is fed on lead 11 to frequency divider 13 illustrated in the left upper portion of FIG. 2. Frequency divider 13 divides the frequency of the phase modulated wave, and therefore the maximum phase deviation by a factor of 4. The output of frequency divider 13 is a phase modulated subharmonic wave having a 3 KHz unmodulated carrier component and an infinite number of pairs of sum and difference side-band frequencies. Frequency divider 13 includes a transistor driver 29 and a pair of flip-flops 31 and 33 having their clock inputs coupled to the output of the transistor driver. Transistor driver 29 is a conventional discrete circuit for interfacing CMOS integrated circuits to other logic families. Transistor driver 29 converts the phase-modulated wave to an appropriate level for application to flip-flop 31 and 33. The two flips-flops 31 and 33 comprise a two-stage ring counter preferably constituted by a conventional CMOS integrated circuit commercially available as a model 4027 dual J-K master-slave flip-flop from RCA. The ring counter is a shift register that has its outputs cross-coupled to its inputs forming a complementary shift register; the Q output of the second stage 33 goes to the K input of the first stage 31; the $\overline{Q}$ output of the second stage 33 goes to the J input of the first stage 31; all other stage interconnections are made as in an ordinary shift register. The Q and $\overline{Q}$ outputs of the two stages provide four symmetrical square waves of one-fourth the input frequency. Thus, the ring counter can be utilized as a divide-by-four circuit by taking any of the four outputs. The phase of each of the four outputs is shifted by 90° from its neighbors. Each of the outputs is a phase-modulated subharmonic wave having a 3 KHz unmodulated carrier component and an infinite number of pairs of sum and difference side-band frequencies. FIG. 3(b) depicts the unmodulated carrier component of the waveform of the $\overline{Q}$ output of the first stage 31. FIG. 3(c) depicts the unmodulated carrier component of the 180° phase-shifted Q output of the first stage 31. The $\overline{Q}$ output is coupled to synchronous filter 17 on lead 15 and the 180° phase-shifted Q output is coupled on lead 23 to phase comparison means 25 to be described subsequently.

Synchronous filter 17 is a digitally controlled analog bandpass filter including four low pass RC filters. The bandpass of synchronous filter 17 is determined by the RC time constant. The first and second low pass filters are comprised of a pair of switches SWA and SWD; a resistor 35 coupled between the $\overline{Q}$ output of the first stage 31 of the ring counter and the inputs of switches SWA and SWD, a capacitor 37 coupled between the output of switch SWA and ground, and a capacitor 39 coupled between the output of switch SWD and ground. The third and fourth low pass filters are comprised of another pair of switches SWB and SWC, a resistor 41 coupled between the $\overline{Q}$ output of the first stage 31 of the ring counter and the inputs of switches SWB and SWC, a capacitor 43 coupled between the output of switch SWB and ground, and a capacitor 45 coupled between the output of switch SWC and ground. The switches when closed provide a signal path for the phase-modulated subharmonic wave through the respective low pass filter. As will become evident, the switches in each pair of switches are complementary in the sense that in operation of the phase demodulator when one switch is closed, the other switch is opened and vice-versa. The two complementary pairs of switches are preferably implemented as a conventional CMOS integrated circuit which is commercially available as a model 4016 quad bilateral switch from RCA. A conventional summing amplifier is provided for summing the outputs of the four low pass filters. Summing amplifier 47 includes an operational amplifier 49 having a resistor 51 coupled between its inverting input and the inputs of switches SWA and SWD; and a resistor 53 coupled between its inverting input and the inputs of switches SWB and SWC. A resistor 55 couples the non-inverting input to ground. A feedback loop including resistor 57 is provided around the operational amplifier 49.

An unmodulated 12 KHz reference wave is fed on lead 19 to a second frequency divider 59 illustrated at the left lower portion of FIG. 2. In the above-mentioned missile guidance system, the 12 KHz reference wave would be provided by the source of the two quadrature signals which are used to generate the phase-modulated wave. Since there is no fixed phase relationship between the reference wave and the carrier of the phase-modulated wave, the phases of the two waves cannot be directly compared to recover the modulating wave. The second frequency divider 59 divides the frequency of the reference wave by a factor of 4 and provides four symmetrical 3 KHz square waves for closing each of the switches SWA, SWD, SWB, and SWC during overlapping equal duration time periods repeated at the frequency of the 3 KHz unmodulated carrier component of the phase-modulated subharmonic wave on lead 15. The second frequency divider 59 includes a transistor driver 61 and a pair of flip-flops 63 and 65. Transistor driver 61 is a conventional discrete circuit similar to transistor driver 29 for interfacing CMOS integrated circuits. The two flip-flops 63 and 65 comprise a two stage ring counter which is preferably constituted by the same model integrated circuit as the first ring counter discussed previously. The output leads from the frequency divider 59 are taken from both stages of the ring counter and are connected to the control inputs of the model 4016 quad bilateral switch as follows: the complementary outputs $\overline{Q}$ and Q of flip-flop 63 to the switches SWA and SWD respectively; and the complementary outputs $\overline{Q}$ and Q of flip-flop 65 to the switches SWB and SWC respectively.

The $\overline{Q}$ and Q outputs of the two stages provide four square wave outputs of one-fourth the frequency of the reference wave shifted in phase from one another by 90°. Each output is up half the time and down half the time. The up time periods and the down time periods are repeated at a frequency of 3 KHz. Exemplary waveforms for the control input signals to switch SWA, switch SWD, switch SWB and switch SWC are shown in FIGS. 3(d), 3(e), 3(f) and 3(g) respectively. The switches are closed by a high control signal and opened by a low control signal. FIG. 3(b) depicts the waveform of the unmodulated carrier component of the phase modulated subharmonic wave which is inputted to synchronous filter 17 on lead 15. As explained, the reference wave on lead 19 has an indeterminate phase relationship with the phase modulated wave on lead 11 and thus with the unmodulated carrier component of the phase modulated subharmonic wave on lead 15. For illustration purposes, however, it will be assumed that the relative phase of the unmodulated carrier component of the phase modulated subharmonic wave on lead 15 and the control input signals, which are derived from the reference wave on lead 19 is as shown in FIGS. 3(b) and 3(d)-3(g).

Referring to FIGS. 3(b) and 3(d)-3(g), it is seen that the openings and closings of the switches repeated at 3 KHz occur synchronously with amplitude variation of the 3 KHz unmodulated carrier component. Thus, for the exemplary waveforms shown, switch SWA is closed during the positive half and open during the negative half of each cycle of the 3 KHz signal carrier component. Switch SWD is closed during the negative half and open during the positive half of each cycle of the 3 KHz signal carrier component. Switches SWB and SWC are closed half the time and open half the time during each half cycle of the 3 KHz unmodulated carrier component. Thus, each filter is always switched into the circuit during the same portion of the waveform of the 3 KHz signal carrier component. Each capacitor then charges to the average value of the waveform during its sample period. In the example shown, capacitor 37 coupled between switch SWA and ground charges to the positive peak amplitude of the 3 KHz unmodulated carrier component, whereas capacitor 39 coupled between switch SWD and ground charges to the negative peak amplitude of the 3 KHz unmodulated carrier component. Capacitors 43 and 45, coupled respectively between switches SWB and SWC and ground, remain uncharged. In general, whatever the phase relation between the reference wave and the unmodulated carrier component of the phase-modulated subharmonic wave, each filter is always switched into the circuit during the same portion of the 3 KHz signal carrier component waveform and each capacitor charges to the average value of the waveform during its sample period. The resulting voltages on the capacitors are inputted during the switch closings times to the summing amplifier 47 which combines the sampled amplitudes to recover the 3 KHz signal carrier component of the phase modulated subharmonic wave.

On the other hand, the openings and closings of the switches occur asynchronously with the amplitude variation of the sum and difference side-band frequencies of the phase-modulated subharmonic wave on lead 15. Since the frequencies of the side-bands are not equal to the frequency at which the switches are opened and closed, each filter is switched into the circuit during a different portion of the side-band waveforms on each switching cycle. As a result there is a negligible output from the capacitors 37, 39, 43 and 45 at the side-band frequencies. Thus, the side-band frequencies are rejected, while the carrier component of the phase-modulated subharmonic wave, and harmonics thereof within the bandpass determined by the RC time constant, are passed to the output of the summing amplifier 47. The waveform of the output of the summing amplifier 47 is depicted in FIG. 3(h). The output of the summing amplifier 47 is fed by resistor 67 to an LC filter 69 which includes an inductor 71 in series with a capacitor 73 connected to ground. Filter 69 has a Q of about 6, and functions to reject the harmonics of the unmodulated carrier component of the phase-modulated subharmonic wave and to shift its phase by 90°. This makes the unmodulated carrier component 90° out-of-phase with the carrier of the phase modulated subharmonic wave fed on lead 23 from the Q output of the first stage 31 of the ring counter of frequency divider 13 to the phase comparison means 25. The output of the LC filter 69 is connected to a comparator 75 used as a sine-wave to square-wave converter for squaring the waveform of the unmodulated carrier component of the phase-modulated subharmonic wave. Sine-wave to square-wave converter 75 includes an operational amplifier 77 having a coupling resistor 79 connected to its inverting input and a resistor 81 connected between its non-inverting input and ground. The waveform of the output of the sine-wave to square-wave converter 75 is shown in FIG. 3(i).

The output of the sine wave to square wave converter 75 is fed to the phase comparison means 25 on lead 21. Phase comparison means 25 includes a transistor driver 83; a phase comparator 85 having its signal input connected to the output of the first frequency divider on lead 23, as discussed previously, and its comparator input connected to the output of transistor driver 83; and a filter 87 connected to the output of the phase comparator 85. Transistor driver 83 is a conventional discrete circuit similar to transistor drivers 29 and 61 for interfacing CMOS integrated circuits to other logic families and receives the input on lead 21 from the sine wave-to-square wave converter 75. The phase comparator 85 is preferably the phase comparator unit of a conventional CMOS integrated circuit commercially available as a 4046 phase-locked loop from RCA. Filter 87 is a low pass filter formed by a resistor 89 and a capacitor 91 connected to ground. The phase comparison means 25 compares the phase of the unmodulated carrier component of the phase-modulated subharnomic wave received on lead 21 to the instantaneous phase of the phase-modulated subharmonic wave received on lead 23 to provide an output voltage on lead 27 that is proportional to the difference from 90° of the phase angle between the two received waves. Referring to FIGS. 3(c) and 3(i) it is seen that in the absence of any phase modulation, this phase angle is 90°. The phase angle will differ from 90° only when the instantaneous phase of the phase-modulated subharmonic wave received on lead 23 is varied from its phase at rest. Since in phase modulation, this variation is proportional to the amplitude of the modulating wave, the phase comparison means 25 provides an output voltage on lead 27 that is proportional to the amplitude of the modulating wave.

Therefore, it is apparent that the disclosed phase demodulator is an efficient device for recovering the modulating wave from a phase-modulated wave. The phase demodulator is easy to implement and less complex in form because it dispenses with the phase-locked loop required by the prior art circuitry and the need for plural stages of amplification at the output of the demodulator.

Obviously, many modifications and variations of the present invention are possible in light of the above teachings. It is therefore to be understood that within the scope of the appended claims the invention may be practiced otherwise than as specifically described.

What is claimed as new and desired to be secured by Letters Patent of the United States is:

1. A phase demodulator for recovering the modulating wave from a phase-modulated wave comprising:

a frequency divider for dividing the phase-modulated wave in frequency to produce a phase-modulated subharmonic wave having an unmodulated carrier component and side-band frequencies;

a filter coupled to the output of said frequency divider for rejecting the side-band frequencies while passing the unmodulated carrier component of the phase-modulated subharmonic wave; and phase comparison means coupled to receive the outputs of said frequency divider and said filter for comparing the phase of the unmodulated carrier component to the instantaneous phase of the phase modulated subharmonic wave whereby an output proportional to the amplitude of the modulating wave is provided.

2. The phase demodulator recited in claim 1 wherein said filter includes:

means for sampling the amplitude of the phase-modulated subharmonic wave during time periods repeated at a frequency equal to the frequency of the unmodulated carrier component; and means connected to said sampling means for combining the sampled amplitudes to recover the unmodulated carrier component of the phase-modulated subharmonic wave and harmonics thereof.

3. The phase demodulator recited in claim 1 wherein said frequency divider comprises a ring counter.

4. The phase demodulator recited in claim 2 wherein said filter includes:

means connected to said combining means for rejecting the harmonics while passing the unmodulated carrier component of the phase-modulated subharmonic wave.

5. The phase demodulator recited in claim 4 wherein said filter includes:

means connected to the harmonics rejecting means for squaring the waveform of the unmodulated carrier component of the phase-modulated subharmonic wave.

6. The phase demodulator recited in claim 2 wherein said amplitude sampling means includes: p0 a plurality of low-pass filters;

an equal plurality of normally open switches for providing when closed a signal path for the phase-modulated subharmonic wave through respective ones of the plurality of low-pass filters; and means for closing each of the switches during respective overlapping equal duration time periods repeated at a frequency equal to the frequency of the unmodulated carrier component.

7. The phase demodulator recited in claim 2 wherein said amplitude combining means includes:

a summing amplifier connected to the amplitude sampling means.

8. The phase demodulator recited in claim 4 wherein the harmonics rejecting means includes an LC filter.

9. The phase demodulator recited in claim 5 wherein the waveform squaring means includes a sine-wave to square wave converter.

10. A method for recovering the modulating wave from a phase-modulated wave comprising the steps of:

dividing the phase-modulated wave in frequency to produce a phase-modulated subharmonic wave having an unmodulated carrier component and side-band frequencies;

rejecting the side-band frequencies while passing the unmodulated carrier component of the phase-modulated subharmonic wave; and comparing the phase of the unmodulated carrier component to the instantaneous phase of the phase-modulated subharmonic wave to provide an output proportional to the amplitude of the modulating wave.

11. The method recited in claim 10 wherein the rejecting step includes the steps of:

sampling the amplitude of the phase-modulated subharmonic wave during time periods repeated at a frequency equal to the frequency of the unmodulated carrier component; and combining the sampled amplitudes to recover the unmodulated carrier component of the phase-modulated subharmonic wave and harmonics thereof.

12. The method recited in claim 11 wherein the rejecting step includes the step of:

rejecting the harmonics while passing the unmodulated carrier component of the phase-modulated subharmonic wave.

13. The method recited in claim 12 wherein the rejecting step includes the steps of:

squaring the waveform of the unmodulated carrier component of the phase-modulated subharmonic wave.

* * * * *